(12) United States Patent
Kim (10) Patent No.: US 10,295,148 B2
(45) Date of Patent: May 21, 2019

(54) LENS AND LIGHT-EMITTING ELEMENT MODULE COMPRISING SAME

(71) Applicant: LG INNOTEK CO., LTD., Seoul (KR)

(72) Inventor: Ki Hyun Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/560,123

(22) PCT Filed: Jan. 14, 2016

(86) PCT No.: PCT/KR2016/000380
§ 371 (c)(1),
(2) Date: Sep. 20, 2017

(87) PCT Pub. No.: WO2016/159499
PCT Pub. Date: Oct. 6, 2016

(65) Prior Publication Data
US 2018/0100632 A1    Apr. 12, 2018

(30) Foreign Application Priority Data

Apr. 3, 2015  (KR) .......................... 10-2015-0047458

(51) Int. Cl.
| | |
|---|---|
| *F21V 5/04* | (2006.01) |
| *H01L 33/58* | (2010.01) |
| *F21S 43/20* | (2018.01) |
| *F21S 41/143* | (2018.01) |
| *F21S 43/14* | (2018.01) |
| *F21Y 115/10* | (2016.01) |
| *G02B 3/00* | (2006.01) |
| *F21S 41/255* | (2018.01) |

(52) U.S. Cl.
CPC .............. *F21V 5/04* (2013.01); *F21S 41/143* (2018.01); *F21S 43/14* (2018.01); *F21S 43/26* (2018.01); *H01L 33/58* (2013.01); *F21S 41/255* (2018.01); *F21Y 2115/10* (2016.08); *G02B 3/00* (2013.01)

(58) Field of Classification Search
CPC .... F21V 5/046; G02B 3/00; G02B 2003/0093
USPC .................................... 359/642; 362/311.02
See application file for complete search history.

(56) References Cited

U.S. PATENT DOCUMENTS

| | | | |
|---|---|---|---|
| 7,461,960 | B2 | 12/2008 | Opolka et al. |
| 2003/0235050 | A1 | 12/2003 | West et al. |

(Continued)

FOREIGN PATENT DOCUMENTS

| | | |
|---|---|---|
| JP | 2004-133391 A | 4/2004 |
| JP | 2005-19662 A | 1/2005 |

(Continued)

*Primary Examiner* — Sean P Gramling
*Assistant Examiner* — Keith G. Delahoussaye
(74) *Attorney, Agent, or Firm* — Birch, Stewart, Kolasch & Birch, LLP (57) ABSTRACT

An example provides a lens comprising: a first body; a second body on the first body; and a curved surface part on the second body, wherein a groove is formed on the inside of the first body and the second body; the first body is arranged so as to protrude from the second body at the boundary area of the first body and the second body; the side wall of the first body absorbs light; and the side wall of the second body is inclined in the central direction.

19 Claims, 5 Drawing Sheets

(56) References Cited

U.S. PATENT DOCUMENTS

| | | | |
|---|---|---|---|
| 2009/0135581 A1* | 5/2009 | Yano | H01L 33/44 |
| | | | 362/84 |
| 2011/0249451 A1* | 10/2011 | Fujii | G02B 27/0955 |
| | | | 362/317 |
| 2014/0167594 A1 | 6/2014 | Kim et al. | |
| 2014/0168970 A1* | 6/2014 | Choi | F21V 5/04 |
| | | | 362/235 |
| 2014/0301085 A1* | 10/2014 | Hwang | F21V 5/04 |
| | | | 362/308 |

FOREIGN PATENT DOCUMENTS

| | | |
|---|---|---|
| JP | 2006-237199 A | 9/2006 |
| JP | 2011-77168 A | 4/2011 |
| KR | 10-1299528 B1 | 8/2013 |
| KR | 10-2013-0104026 A | 9/2013 |
| KR | 10-2013-0108019 A | 10/2013 |

* cited by examiner

| Beam Angle | Field Angle |
|---|---|
| 121.02 | 152.32 |

[Fig. 5b]

Conventional Art

| Beam Angle | Field Angle |
|---|---|
| 119.54 | 164.07 |

[Fig. 5c]

Conventional Art

| Beam Angle | Field Angle |
|---|---|
| 128.55 | 175.93 |

[Fig. 6a]

Conventional Art

[Fig. 6b]

Conventional Art

LENS AND LIGHT-EMITTING ELEMENT MODULE COMPRISING SAME

CROSS REFERENCE TO RELATED APPLICATIONS

This application is the National Phase of PCT International Application No. PCT/KR2016/000380, filed on Jan. 14, 2016, which claims priority under 35 U.S.C. 119(a) to patent application Ser. No. 10-2015-0047458, filed in the Republic of Korea on Apr. 3, 2015, all of which are hereby expressly incorporated by reference into the present application.

TECHNICAL FIELD

Embodiments relate to a lens and a light-emitting element module having the same.

BACKGROUND ART

Group III-V compound semiconductors such as, for example, GaN and AlGaN, are widely used for optoelectronics, electronic devices and the like, owing to many advantages such as, for example, a wide and easily adjustable band gap energy.

In particular, light-emitting elements such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as, for example, fluorescent lamps and incandescent lamps.

Accordingly, the application of light-emitting elements has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

A molding part may be disposed around a light-emitting element to protect, for example, a light-emitting structure or wires. Since light is refracted when passing through the molding part, which is formed of, for example, silicon, the molding part may serve as a primary lens.

However, when the light-emitting element is used as a light source of a lighting apparatus, a secondary lens may be used in order to adjust the path along which light is emitted. The aforementioned secondary lens is commonly referred to as a "lens".

An optical path may be changed depending on the material of the lens and particularly on the shape thereof. In particular, in an application in which the light emitted from the light source needs to be directed in a specific direction such as, for example, forward or rearward, the shape of the lens is of increased importance.

Based on the shape of the lens, a beam angle or a field angle, which corresponds to the distribution of light emitted from a light-emitting element module including the lens, may be determined. The light emitted from the light-emitting element module may have various intensity distributions depending on the angle. Although the beam angle, which represents the range of distribution of light having intensity of half or more the maximum intensity, is very important, the field angle, which represents the range of distribution of light having intensity of one tenth or more the maximum intensity, is also important.

When the field angle is excessively wide, the light from the light-emitting element module is emitted to an excessively wide range, which may deteriorate luminous efficacy.

Technical Object

Embodiments provide a lens, which reduces the field angle of light emitted from a light-emitting element module.

Technical Solution

One embodiment provides a lens including a first body, a second body on the first body, and a curved surface portion on the second body, wherein a groove is formed in the first body and the second body, the first body is disposed so as to protrude from the second body at a boundary of the first body and the second body, and the first body has a sidewall that absorbs light, and the second body has a sidewall that is inclined in a central direction.

A ratio of a height of the first body and a height of the second body may be 0.23:0.336, and the ratio may have a tolerance of 10%.

A ratio of a height of the first body and a height of the entire lens may be 0.23:0.855, and the ratio may have a tolerance of 10%.

A ratio of a height of the second body and a height of the entire lens may be 0.336:0.855, and the ratio may have a tolerance of 10%.

A ratio of a length of the first body and a maximum radius of the second body may be 1:0.728, and the ratio may have a tolerance of 10%.

A ratio of a length of the first body and a minimum radius of the second body may be 1:0.665, and the ratio may have a tolerance of 10%.

A ratio of a minimum radius and a maximum radius of the second body may be 0.665:0.728, and the ratio may have a tolerance of 10%.

Another embodiment provides a light-emitting element module including the above-described lens and a light source disposed in the groove of the lens, wherein a ratio of a length of the first body and a maximum horizontal distance from an edge of an emission surface of the light source to an edge of the second body is 1:0.378, and the ratio has a tolerance of 10%.

A ratio $\theta_{12}/\theta_{11}$ of an angle $\theta_{12}$, which is defined by an emission surface of the lens and light $L_{12}$, which is emitted from the emission surface of the lens when light $L_{11}$ is refracted at the emission surface of the lens, to an angle $\theta_{11}$, which is defined by the emission surface of the light source and the light $L_{11}$, which is emitted from a center area of the emission surface of the light source and passes through the edge of the second body at the boundary of the first body and the second body, may be greater than 1.04.

A ratio $\theta_{22}/\theta_{21}$ of an angle $\theta_{22}$, which is defined by an emission surface of the lens and light $L_{22}$, which is emitted from the emission surface of the lens when light $L_{21}$ is refracted at the emission surface of the lens, to an angle $\theta_{21}$, which is defined by the emission surface of the light source and the light $L_{21}$, which is emitted from an edge area of the emission surface of the light source and passes through the edge of the second body at the boundary of the first body and the second body, may be greater than 1.22.

A ratio $\theta_{32}/\theta_{31}$ of an angle $\theta_{32}$, which is defined by an emission surface of the lens and light $L_{32}$, which is emitted from the emission surface of the lens when light $L_{31}$ is refracted at the emission surface of the lens, to an angle $\theta_{31}$, which is defined by the emission surface of the light source and the light $L_{31}$, which is emitted from a center area of the emission surface of the light source and passes through the edge of the second body at a boundary of the second body and the curved surface portion, may be greater than 1.34.

A ratio $\theta_{42}/\theta_{41}$ of an angle $\theta_{42}$, which is defined by an emission surface of the lens and light $L_{42}$, which is emitted from the emission surface of the lens when light $L_{41}$ is refracted at the emission surface of the lens, to an angle $\theta_{41}$, which is defined by the emission surface of the light source and the light $L_{41}$, which is emitted from an edge area of the emission surface of the light source and passes through the edge of the second body at a boundary of the second body and the curved surface portion, may be greater than 1.80.

A further embodiment provides a light-emitting element module including a lens including a first body, a second body on the first body, and a curved surface portion on the second body, wherein a groove is formed in the first body and the second body, the first body is disposed so as to protrude from the second body at a boundary of the first body and the second body, and the first body has a sidewall that absorbs light, and the second body has a sidewall that is inclined in a central direction, and a light source disposed in the groove of the lens, wherein a ratio $\theta_{12}/\theta_{11}$ of an angle $\theta_{12}$, which is defined by an emission surface of the lens and light $L_{12}$, which is emitted from the emission surface of the lens when light $L_{11}$ is refracted at the emission surface of the lens, to an angle $\theta_{11}$, which is defined by an emission surface of the light source and the light $L_{11}$, which is emitted from a center area of the emission surface of the light source and passes through an edge of the second body at the boundary of the first body and the second body, is greater than 1.04, and wherein a ratio $\theta_{22}/\theta_{21}$ of an angle $\theta_{22}$, which is defined by the emission surface of the lens and light $L_{22}$, which is emitted from the emission surface of the lens when light $L_{21}$ is refracted at the emission surface of the lens, to an angle $\theta_{21}$, which is defined by the emission surface of the light source and the light $L_{21}$, which is emitted from an edge area of the emission surface of the light source and passes through the edge of the second body at the boundary of the first body and the second body, is greater than 1.22.

A ratio $\theta_{32}/\theta_{31}$ of an angle $\theta_{32}$, which is defined by the emission surface of the lens and light $L_{32}$, which is emitted from the emission surface of the lens when light $L_{31}$ is refracted at the emission surface of the lens, to an angle $\theta_{31}$, which is defined by the emission surface of the light source and the light $L_{31}$, which is emitted from the center area of the emission surface of the light source and passes through the edge of the second body at a boundary of the second body and the curved surface portion, may be greater than 1.34, and a ratio $\theta_{42}/\theta_{41}$ of an angle $\theta_{42}$, which is defined by the emission surface of the lens and light $L_{42}$, which is emitted from the emission surface of the lens when light $L_{41}$ is refracted at the emission surface of the lens, to an angle $\theta_{41}$, which is defined by the emission surface of the light source and the light $L_{41}$, which is emitted from the edge area of the emission surface of the light source and passes through the edge of the second body at the boundary of the second body and the curved surface portion, may be greater than 1.80.

Advantageous Effects

Light emitted from a lens and a light-emitting element module having the same according to embodiments may exhibit a reduced field angle, thus achieving increased luminous efficacy.

BEST MODE

Hereinafter, embodiments will be described in detail with reference to the accompanying drawings, in order to concretely realize the object described above.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

Figure 1A:
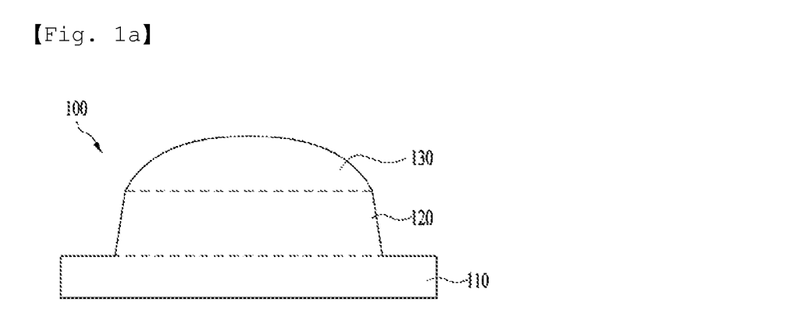
FIG. 1a is a view illustrating a configuration of a lens according to an embodiment.
Figure 1B:
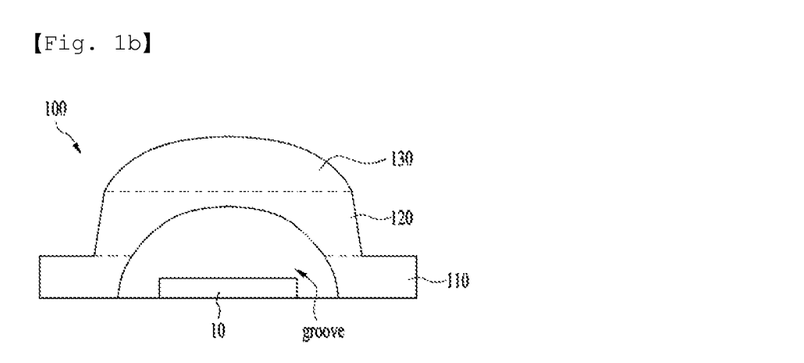
FIG. 1b is a cross-sectional view illustrating a light-emitting element disposed in the lens of FIG. 1a, FIG. 1c is a plan view of the lens of FIG. 1b.
Figure 1C:
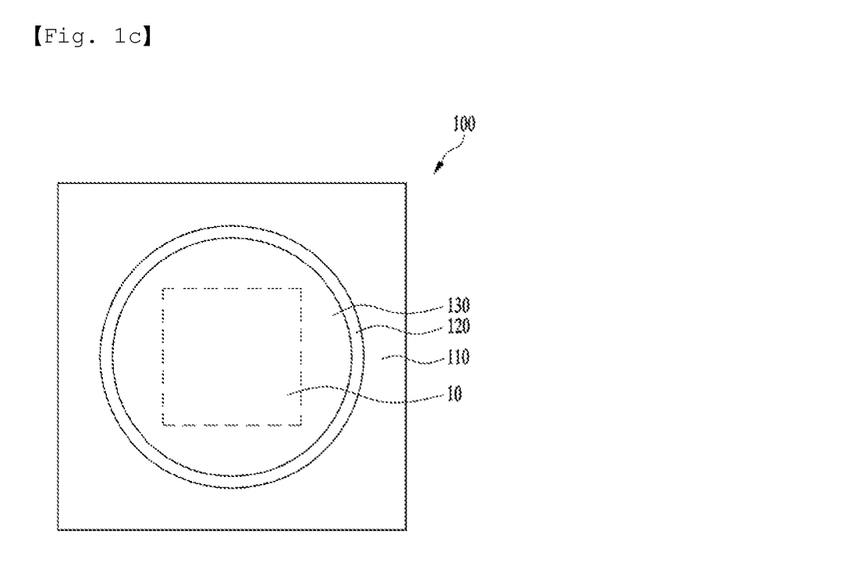

FIG. 1a is a view illustrating a configuration of a lens according to an embodiment, FIG. 1b is a cross-sectional view illustrating a light-emitting element disposed in the lens of FIG. 1a, and FIG. 1c is a plan view of the lens of FIG. 1b.

The lens 100 according to the embodiment may include a first body 110, a second body 120, and a curved surface portion 130, and the first body 110, the second body 120, and the curved surface portion 130 may be formed of the same material, for example, a silicon-based material.

A groove may be formed in the first body 110 and the second body 120, and at least a portion of a light source such as, for example, a light-emitting element 10, may be inserted into and disposed in the groove.

The top surface of the groove, i.e. the boundary of the first body 110, the second body 120 and the groove may be a curved surface, specifically, a spherical surface or an aspherical surface.

The horizontal cross section of the first body 110 may have a circular shape, an oval shape, or a polygonal shape, the first body 110 may have a constant thickness, and the first body 110 may be disposed under the second body 120 so as to protrude from the second body 120, without being limited thereto.

The sidewall of the first body 110 may absorb light, and the sidewall of the second body 120 and the curved surface portion 130 may transmit light. When the sidewall of the first body 110 has light-transmitting characteristics, the quantity of light that is emitted from the light-emitting element 10 and passes through the first body 110 to thereby be directed to the outside may increase, causing an increase in the field angle of the light-emitting element module. The second body 120 may have a circular horizontal cross-sectional shape, and the sidewall of the second body 120 may be inclined in the central direction. That is, the diameter or radius of the second body at the boundary of the first body 110 and the second body 120 may be greater than the diameter or radius of the second body at the boundary of the second body 120 and the curved surface portion 130, and thus the sidewall of the second body may be inclined in the inward direction of the lens 100 from the bottom to the top of FIG. 1a.

The surface of the curved surface portion 130 may be curved, and for example, may be formed into a spherical surface or an aspherical surface.

In FIG. 1c, the light-emitting element 10 is disposed as designated by the dotted line, and the horizontal cross section of the light-emitting element 10 may have a rectangular shape, or any shape other than the illustrated square shape.

Figure 2:
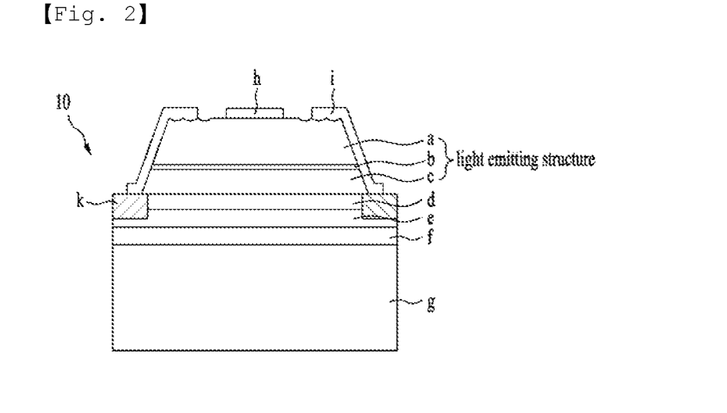
FIG. 2 is a view illustrating the light-emitting element of FIG. 1b.

FIG. 2 is a view illustrating the light-emitting element of FIG. 1b.

As an embodiment of the light-emitting element, a light-emitting diode is illustrated. In the light-emitting diode, a bonding layer f, a reflective layer e, and an ohmic layer d may be sequentially disposed on a support substrate g, a light-emitting structure may be disposed on the ohmic layer d, and a channel layer k may be disposed in an edge area under the light-emitting structure.

The support substrate g may be a base substrate, and may be formed of at least one selected from among, for example, copper (Cu), gold (Au), nickel (Ni), molybdenum (Mo), copper-tungsten (Cu—W). In addition, the support substrate g may be configured as a carrier wafer using, for example, Si, Ge, GaAs, ZnO, SiC, SiGe, $Ga_2O_3$, or GaN.

The bonding layer f may be disposed on the support substrate g The bonding layer f may bond the reflective layer e to the support substrate g. The bonding layer f may include, for example, at least one of Ti, Au, Sn, Ni, Cr, Ga, In, Bi, Cu, Ag and Ta.

The reflective layer e may be formed on the bonding layer f. The reflective layer e may be formed in a single layer or in multiple layers using any one selected from among materials having excellent reflection characteristics, for example, silver (Ag), nickel (Ni), aluminum (Al), rubidium (Rb), palladium (Pd), iridium (Ir), ruthenium (Ru), magnesium (Mg), zinc (An), platinum (Pt), gold (Au), hafnium (Hf) and selective combinations thereof, or using the metal material and a light-transmitting conductive material such as, for example, IZO, IZTO, IAZO, IGZO, IGTO, AZO, or ATO. In addition, the reflective layer e may be, for example, the stack of IZO/Ni, AZO/Ag, IZO/Ag/Ni, or AZO/Ag/Ni, without being limited thereto.

The ohmic layer d may be formed on the reflective layer e. The ohmic layer may be in ohmic contact with the lower surface of the light-emitting structure, and may be configured as a layer or a plurality of patterns. The ohmic layer d may selectively use a light-transmitting electrode layer and a metal, and may be formed in a single layer or in multiple layers using one or more selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni, Ag, Ni/IrOx/Au, and Ni/IrOx/Au/ITO.

The support substrate g, the bonding layer f, the reflective layer e and the ohmic layer d may form a first electrode, and may supply current to the light-emitting structure.

The channel layer k may be disposed between the first electrode and the light-emitting structure. The channel layer k may be disposed on the edge area under the light-emitting structure, and may be formed of a light-transmitting material such as, for example, a metal oxide, a metal nitride, a light-transmitting nitride, or a light-transmitting oxide, may be formed as a light-transmitting insulation layer. For example, the channel layer k may be formed using one selected from among indium tin oxide (ITO), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, SiOxNy, Si3N4, Al2O3 and TiO2.

The light-emitting structure may be disposed on the first electrode. The light-emitting structure includes a first conductive semiconductor layer a, an active layer b, and a second conductive semiconductor layer c.

The first conductive semiconductor layer a may be formed using, for example, group III-V or II-VI compound semiconductors, and may be doped with a first conductive dopant. The first conductive semiconductor layer a may be formed of a semiconductor material having a composition equation of $Al_xIn_yGa_{(1-x-y)}N$ (0≤x≤1, 0≤y≤1, 0≤x+y≤1), for example, any one or more selected from among AlGaN, GaN, InAlGaN, AlGaAs, GaP, GaAs, GaAsP, and AlGaInP.

When the first conductive semiconductor layer a is an n-type semiconductor layer, the first conductive dopant may include an n-type dopant such as, for example, Si, Ge, Sn, Se, or Te. The first conductive semiconductor layer a may be formed in a single layer or in multiple layers, without being limited thereto.

The active layer b may be disposed between the first conductive semiconductor layer a and the second conductive semiconductor layer c, and may include any one of a single well structure, a multi-well structure, a single quantum well structure, a multi quantum well (MQW) structure, a quantum dot structure, and a quantum line structure.

The active layer b may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto.

The well layer may be formed of a material that has a smaller energy band gap than the energy band gap of the barrier layer.

The second conductive semiconductor layer c may be formed using compound semiconductors. The second conductive semiconductor layer c may be formed of, for example, group III-V or II-VI compound semiconductors, and may be doped with a second conductive dopant. The second conductive semiconductor layer c may be formed of a semiconductor material having a composition equation of $In_xAl_yGa_{(1-x-y)}N$ (0≤x≤1, 0≤y≤1, 0≤x+y≤1), for example, any one or more selected from among AlGaN, GaN, AlInN, AlGaAs, GaP, GaAs, GaAsP, and AlGaInP.

When the second conductive semiconductor layer c is a p-type semiconductor layer, the second conductive dopant may be a p-type dopant such as, for example, Mg, Zn, Ca, Sr or Ba. The second conductive semiconductor layer c may be formed in a single layer or in multiple layers, without being limited thereto.

Although not illustrated, an electron blocking layer may be disposed between the active layer b and the second conductive semiconductor layer c. The electron blocking layer may have the structure of a super-lattice. For example, the super-lattice may be formed by disposing AlGaN doped with a second conductive dopant and alternately disposing a plurality of GaN layers having different composition rates of aluminum, without being limited thereto.

The surface of the first conductive semiconductor layer a may have a pattern such as, for example, convex and concave portions in order to increase light extraction efficiency. A second electrode h is disposed on the surface of the first conductive semiconductor layer a. As illustrated, the surface of the first conductive semiconductor layer a, on which the second electrode h is disposed, may or may not be patterned along the surface of the first conductive semiconductor layer a. The second electrode h may be formed in a single layer or in multiple layers using at least one selected from among aluminum (Al), titanium (Ti), chrome (Cr), nickel (Ni), copper (Cu) and gold (Au).

A current blocking layer (not illustrated) may be disposed under the light-emitting structure so as to correspond to the second electrode h. The current blocking layer j may be formed using an insulating material. The current blocking layer j may cause the current supplied from the direction of the support substrate g to be uniformly supplied to the entire area of the second conductive semiconductor layer c. A passivation layer i may be formed around the light-emitting structure. The passivation layer i may be formed of an insulating material, and the insulating material may include a non-conductive oxide or nitride. In one example, the passivation layer i may be configured as a silicon oxide ($SiO_2$) layer, a nitride oxide layer, or an aluminum oxide layer.

Although FIG. 2 illustrates a vertical light-emitting element, any one of various other light sources such as, for example, a horizontal light-emitting element or a flip-chip-type light-emitting element may be disposed.

In the above-described embodiment, although the light-emitting element 10 may be disposed in a groove, a portion of a light-emitting element package or a circuit board that includes the light-emitting element 10 may be inserted into and disposed in the groove, and the structure in which the above-described lens is disposed on the light-emitting element or the light-emitting element package may be referred to as a light-emitting element module.

Figure 3:
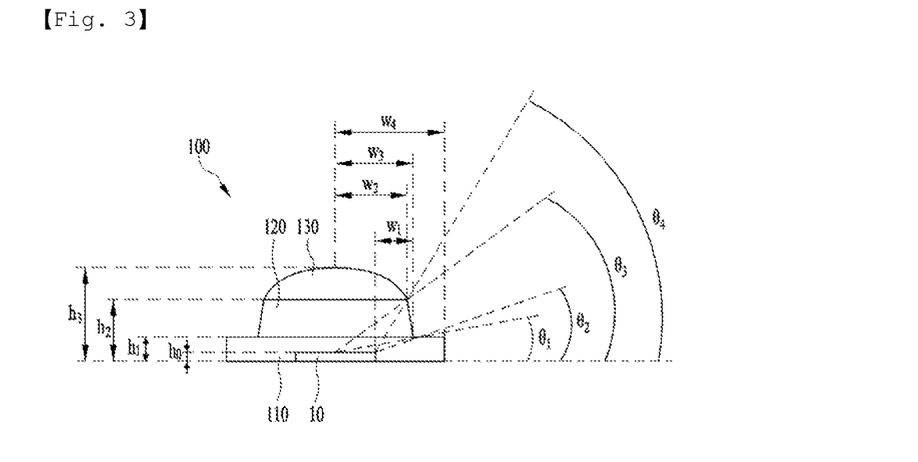
FIG. 3 is a view illustrating, for example, the sizes of respective components of the lens.

FIG. 3 is a view illustrating, for example, the sizes of respective components of the lens.

The ratio of the height h0 of the light source 10, the height h1 of the first body 110, the height of the second body 120 and the height h3 of the entire lens 100 illustrated in FIG. 3 may be 0.7:0.23:0.336:0.855, and the ratio of the respective heights may have a tolerance of 10%.

The above-described heights h0, h1, h2 and h3 are vertical distances of the respective parts in FIG. 3, and the lengths to be described below, for example, the length of the first body 110, are the horizontal distances of the respective parts in FIG. 3. The horizontal distance of the first body 110 may be constant, and the horizontal distance of the second body 120 may be greater at the bottom than at the top.

In addition, the ratio of half W4 the length of the first body 110, the maximum radius W3 of the second body, the minimum radius W2 of the second body 120, and the horizontal distance W1 from the edge of an emission surface of the light source 10 to the maximum radius of the second body 120 may be 1:0.728:0.665:0.378, and the ratio may have a tolerance of 10%.

When the length of the first body 110 is greater than the above-described ratio relative to the maximum radius W3 of the second body, the minimum radius W2 of the second body 120, and the horizontal distance W1 from the edge of the emission surface of the light source 10 to the maximum radius of the second body 120, the horizontal size of the lens 100 may increase, which may increase the volume of the light-emitting element module having the lens. When the ratio of the maximum radius W3 of the second body relative to half W2 the length of the first body 110 is greater than 0.728, when the minimum radius W2 of the second body 120 relative to half W2 the length of the first body 110 is greater than 0.665, or when the ratio of the horizontal distance W1 from the edge of the emission surface of the light source 10 to the maximum radius of the second body 120 relative to half W2 the length of the first body 110 is greater than 0.378, the horizontal size of the second body 120 may increase, and thus the angles $\theta 1$, $\theta 2$, $\theta 3$ and $\theta 4$ illustrated in FIG. 3 may increase, which may increase the field angle.

The angles $\theta 1$, $\theta 2$, $\theta 3$ and $\theta 4$, which are defined between the emission surface and the respective paths of the light that is emitted from the center area or the edge area of the emission surface of the light source 10 and passes through the edge of the second body 120 at the boundary of the first body 110 and the second body 120 or the edge of the second body 120 at the boundary of the second body 120 and the curved surface portion 130, are illustrated. This will be described below with reference to FIGS. 4a to 4d.

FIGS. 4a to 4d are views illustrating the paths of light emitted from the light-emitting element.

The emission surface of the light source 10 has a center area and two edge areas P11 and P12, the second body 120 has two edge areas P21 and P22 at the boundary of the first body 110 and the second body 120, and the second body 120 has two edge areas P31 and P32 at the boundary of the second body 120 and the curved surface portion 130. In addition, a center area O of the second body 120 at the boundary of the first body 110 and the second body 120 and a center area O' of the second body 120 at the boundary of the second body 120 and the curved surface portion 130 may be located respectively in the vertical direction of the center area c of the emission surface.

Figure 4A:
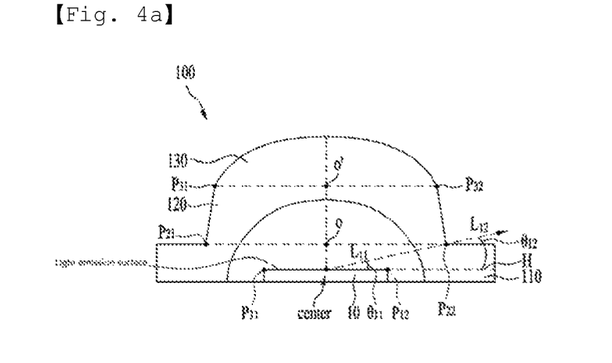
FIGS. 4a to 4d are views illustrating the paths of light emitted from the light-emitting element.

In FIG. 4a, the ratio $\theta_{12}/\theta_{11}$ of the angle $\theta_{12}$, which is defined by the emission surface of the lens 100 and the light $L_{12}$ that is emitted from the emission surface of the lens 100 when light $L_{11}$ is refracted at the emission surface of the lens 100, to the angle $\theta_{11}$, which is defined by the emission surface and the light $L_{11}$ that is emitted from the center area c of the emission surface of the light source 10 and passes through the edge area P22 of the second body 120 at the boundary of the first body 110 and the second body 120, may be greater than 1.04.

The following Table 1 indicates variation in the field angle depending on variation in the above-described angular ratio $\theta_{12}\theta_{11}$ when the length of the light source 10 is 0.7 mm in FIG. 4a, and the angular ratio and the field angle are respectively rounded off to the third decimal place.

As illustrated, the field angle is 154 degrees or more when the ratio $\theta_{22}/\theta_{21}$ of the angle $\theta_{22}$ is below 1.22 and more particularly, 1.19 or less, and the field angle is below 153 degrees when the ratio is above 1.22, and more particularly, 1.28 or more.

TABLE 1

| Field Angle | 155.16 | 156.97 | 154.22 | 153.14 | 149.38 | 147.93 | 146.70 | 148.02 |
|---|---|---|---|---|---|---|---|---|
| $\Theta_{12}/\Theta_{11}$ | 0.91 | 0.94 | 0.97 | 0.98 | 1.07 | 1.08 | 1.10 | 1.11 |

Figure 4B:
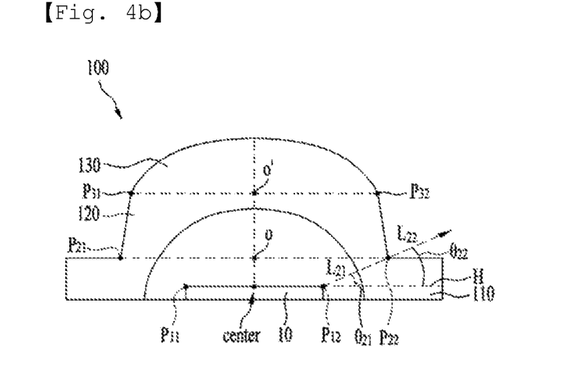

FIG. 4b, the ratio $\theta_{22}/\theta_{21}$ of the angle $\theta_{22}$, which is defined by the emission surface of the lens 100 and light $L_{22}$ that is emitted from the emission surface of the lens 100 when light $L_{21}$ is refracted at the emission surface of the lens 100, to the angle $\theta_{21}$, which is defined by the emission surface of the light source 10 and the light $L_{21}$ that is emitted from the edge area P12 of the emission surface of the light source 10 and passes through the edge area P22 of the second body 120 at the boundary of the first body 110 and the second body 120, may be greater than 1.22.

The following Table 2 indicates variation in the field angle depending on variation in the above-described angular ratio $\theta_{22}/\theta_{21}$, when the length of the light source 10 is 0.7 mm in FIG. 4b, and the angular ratio and the field angle are respectively rounded off to the third decimal place.

As illustrated, the field angle is 154 degrees or more when the ratio $\theta_{22}/\theta_{21}$ of the angle $\theta_{22}$ is below 1.22 and more particularly, 1.19 or less, and the field angle is below 153 degrees when the ratio is above 1.22, and more particularly, 1.28 or more.

TABLE 2

| Field Angle | 159.97 | 155.84 | 154.22 | 159.92 | 147.93 | 148.02 | 146.70 | 147.59 |
|---|---|---|---|---|---|---|---|---|
| $\Theta_{22}/\Theta_{21}$ | 1.13 | 1.16 | 1.18 | 1.19 | 1.28 | 1.29 | 1.33 | 1.35 |

Figure 4C:
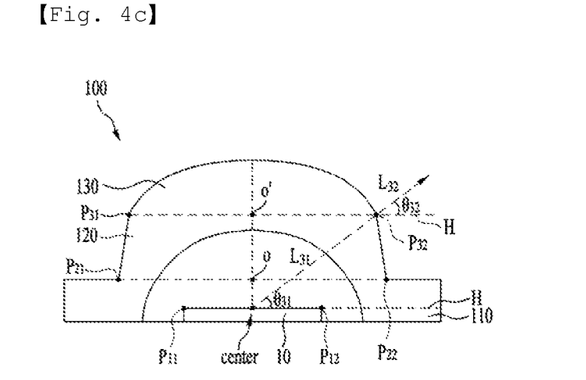

FIG. 4c, the ratio $\theta_{32}/\theta_{31}$ of the angle $\theta_{32}$, which is defined by the emission surface of the lens and light $L_{32}$ that is emitted from the emission surface of the lens 100 when light $L_{31}$ is refracted at the emission surface of the lens 100, to the angle $\theta_{31}$, which is defined by the emission surface of the light source and the light $L_{31}$ that is emitted from the center area c of the emission surface of the light source 10 and passes through the edge area P32 of the second body 120 at the boundary of the second body 120 and the curved surface portion, may be greater than 1.34.

Figure 4D:
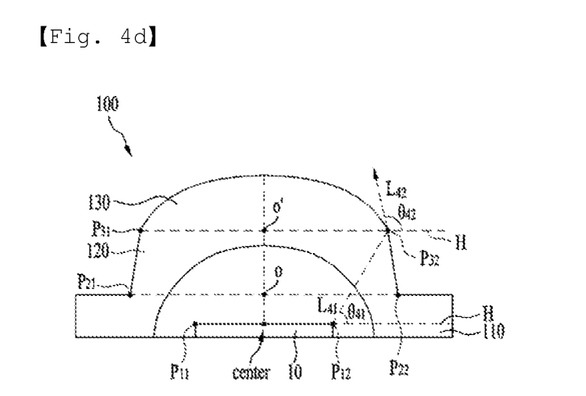

In FIG. 4d, the ratio $\theta_{42}/\theta_{41}$ of the angle $\theta_{42}$, which is defined by the emission surface of the lens 100 and light $L_{42}$ that is emitted from the emission surface of the lens 100 when light $L_{41}$ is refracted at the emission surface of the lens 100, to the angle $\theta_{41}$, which is defined by the emission surface and the light $L_{41}$ that is emitted from the edge area P12 of the emission surface of the light source 10 and passes through the edge area P32 of the second body 120 at the boundary of the second body 120 and the curved surface portion, may be greater than 1.80.

In the embodiments illustrated in FIGS. 4c and 4d, when the ratio $\theta_{32}/\theta_{31}$ and the ratio $\theta_{42}/\theta_{41}$ are respectively greater than 1.34 and 1.80, the field angle may be within a given range, for example, 153 degrees or less.

In FIGS. 4a to 4d, when the ratio of the angle between the light emitted from the light source 10 and the emission surface of the light source 10 and the angle between the light emitted from the light source 10 and the emission surface of the lens is greater than the above-described range, the quantity of light discharged in the lateral direction from the emission surface of the lens 100 may increase, causing an increased field angle. Accordingly, the quantity of light directed in the upward direction from the lens 100 may be reduced, causing reduced luminous efficacy. When the ratios of the above-described angles satisfy the above-described ranges, the field angle may be within the above-described angular ranges, and thus the quantity of light directed in the upward direction from the lens 100 may increase, which may increase luminous efficacy, as will be described below. Here, the upward direction refers to the direction in which the light emitted from the lens 100 is directed to an object with reference to FIGS. 4a to 4d.

Figure 5A:
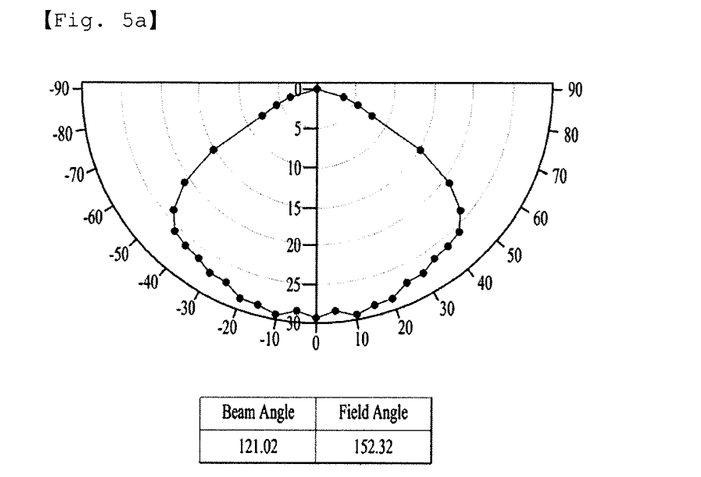
FIGS. 5a to 5c are views illustrating the beam angle and the field angle of light emitted from a light-emitting element module according to an embodiment and the beam angles and the field angles of light emitted from conventional light-emitting element modules.
Figure 5B:
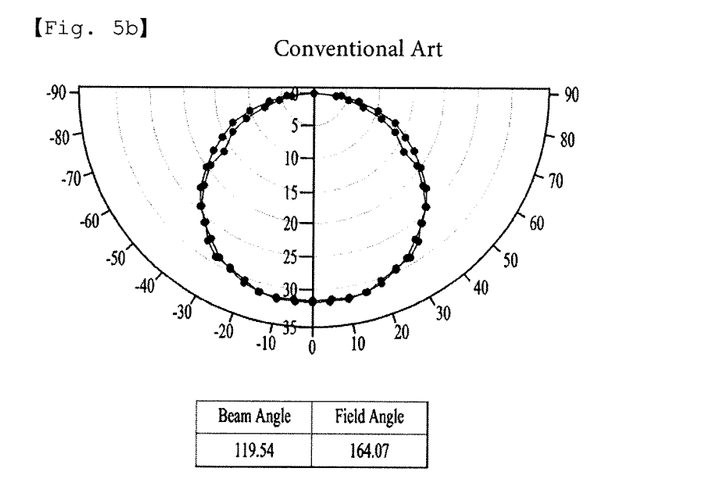
Figure 5C:
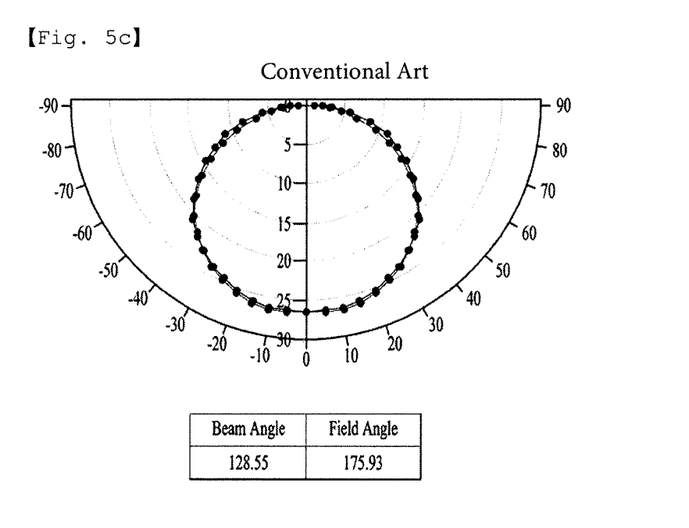

FIGS. 5a to 5c are views illustrating the beam angle and the field angle of light emitted from a light-emitting element module according to an embodiment and the beam angles and the field angles of light emitted from conventional light-emitting element modules.

It can be seen that the field angle of light emitted from the light-emitting element module according to the embodiment illustrated in FIG. 5a is reduced compared to that in the conventional light-emitting element modules of FIGS. 5b and 5c. The beam angle and the field angle of light emitted from the light-emitting element module of FIG. 5b are respectively 119.54 degrees and 164.07 degrees, the beam angle and the field angle of light emitted from the light-emitting element module of FIG. 5c are respectively 128.55 degrees and 175.93 degrees, the beam angle and the field angle of light emitted from the light-emitting element module according to the embodiment of FIG. 5a are respectively 121.02 degrees and 152.32 degrees, and the field angle of FIG. 5a is reduced compared to the field angles of FIGS. 5b and 5c.

Figure 6A:
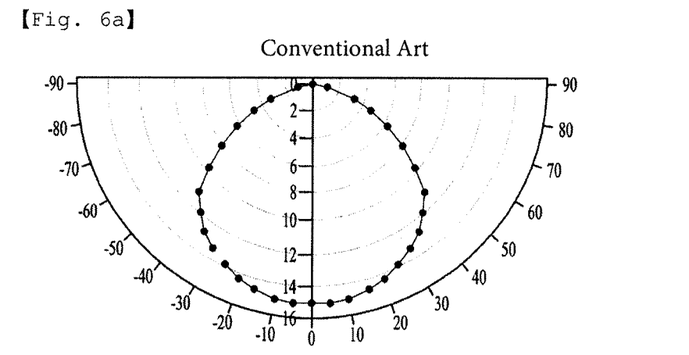
FIGS. 6a and 6b are views illustrating the beam angles, the field angles, and the luminous efficacies of light emitted from conventional light-emitting element modules.
Figure 6B:
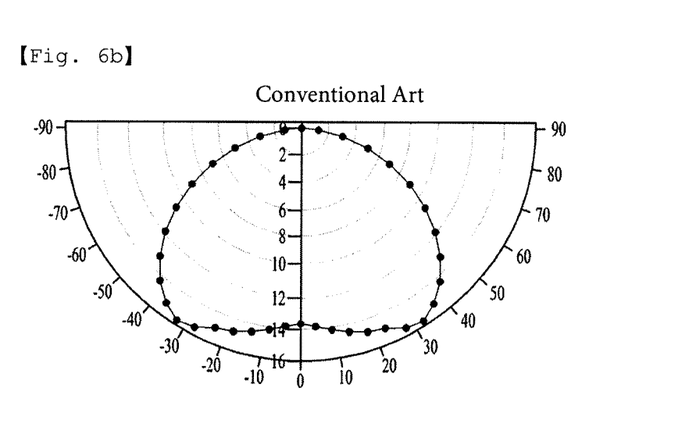

FIGS. 6a and 6b are views illustrating the beam angles, the field angles, and the luminous efficacies of light emitted from conventional light-emitting element modules.

FIG. 6a is the case where a lens or a molding part in which the sidewall absorbs light and the upper surface transmits light is provided, and FIG. 6b is the case where a lens or a molding part in which both the sidewall and the upper surface transmit light is provided. In FIG. 6a, the beam angle is 112.20 degrees, the field angle is 156.23 degrees, and the luminous efficacy is 42.45%. In FIG. 6b, the beam angle is 146.42 degrees, the field angle is 171.75 degrees, and the luminous efficacy is 74.59%.

The light-emitting element module according to the embodiment illustrated in FIG. 5a has a reduced field angle of 152.32 degrees, and thus is improved compared to FIGS. 6a and 6b, and also has an increased luminous efficacy of 88.71% (percentage) compared to the luminous efficacies of 42.45% and 74.59% of FIGS. 6a and 6b. That is, as described above with reference to FIGS. 4a to 4d, since the light refracted at the emission surface of the lens is directed more sharply upward than the light directed from the incident surface to the emission surface of the lens, the quantity of light discharged from the light-emitting element module to thereby be directed beyond the field angle may be reduced, and consequently, the light may be concentrated within the beam angle or the field angle, which may result in increased luminous efficacy.

Although the embodiments have been described above in detail with reference to the accompanying drawings, it will be apparent to those skilled in the art that the embodiments described above is not limited to the embodiments described above, and various substitutions, modifications, and alterations may be devised within the spirit and scope of the embodiments. Accordingly, various embodiments disclosed here are not intended to limit the technical sprit of the disclosure, and the scope of the technical sprit of the present invention is not limited by the embodiments. Accordingly, the disclosed embodiments are provided for the purpose of description and are not intended to limit the technical scope of the disclosure, and the technical scope of the disclosure is not limited by the embodiments. The range of the disclosure should be interpreted based on the following claims, and all technical ideas that fall within the range equivalent to the claims should be understood as belonging to the scope of the disclosure.

INDUSTRIAL APPLICABILITY

A lens and a light-emitting element module having the same according to embodiments may be used in, for example, a lighting apparatus.

The invention claimed is:

1. A lens comprising:
a first body, a second body on the first body, and a curved surface portion on the second body,
wherein a groove is formed in the first body and the second body, the groove being configured to receive an entirety of a light source,
wherein the first body is wider than the second body and is configured to absorb light,
wherein the curved surface portion has a spherical shape,
wherein a vertical cross section of the second body has a trapezoidal shape,
wherein an emission surface of the lens is disposed in the groove, and
wherein a ratio of a height of the first body and a height of the second body is 0.23:0.336 with a tolerance of 10%.

2. The lens according to claim 1, wherein the second body has a sidewall that is inclined in a central direction.

3. The lens according to claim 1, wherein a ratio of a height of the first body and a height of the entire lens is 0.23:0.855, and the ratio has a tolerance of 10%.

4. The lens according to claim 1, wherein a ratio of a height of the second body and a height of the entire lens is 0.336:0.855, and the ratio has a tolerance of 10%.

5. The lens according to claim 1, wherein a ratio of a length of the first body and a maximum radius of the second body is 1:0.728, and the ratio has a tolerance of 10%.

6. The lens according to claim 1, wherein a ratio of a length of the first body and a minimum radius of the second body is 1:0.665, and the ratio has a tolerance of 10%.

7. The lens according to claim 1, wherein a ratio of a minimum radius and a maximum radius of the second body is 0.665:0.728, and the ratio has a tolerance of 10%.

8. A light-emitting element module, comprising:
a lens including a first body, a second body on the first body, and a curved surface portion on the second body; and
a light source,
wherein a groove is formed in the first body and the second body,
wherein the first body is wider than the second body and is configured to absorb light,
wherein an emission surface of the lens is disposed in the groove;
wherein an entirety of the light source is disposed in the groove of the lens,
wherein the curved surface portion has a spherical shape,
wherein a vertical cross section of the second body has a trapezoidal shape, and
wherein a ratio of a length of the first body and a maximum horizontal distance from an edge of an emission surface of the light source to an edge of the second body is 1:0.378, and the ratio has a tolerance of 10%.

9. The module according to claim 8, wherein a ratio ($\theta_{12}/\theta_{11}$) of an angle ($\theta_{12}$), which is defined by an emission surface of the lens and light ($L_{12}$), which is emitted from the emission surface of the lens when light ($L_{11}$) is refracted at the emission surface of the lens, to an angle ($\theta_{11}$), which is defined by the emission surface of the light source and the light ($L_{11}$), which is emitted from a center area of the emission surface of the light source and passes through the edge of the second body at the boundary of the first body and the second body, is greater than 1.04.

10. The module according to claim 8, wherein a ratio ($\theta_{22}/\theta_{21}$) of an angle ($\theta_{22}$), which is defined by an emission surface of the lens and light ($L_{22}$), which is emitted from the emission surface of the lens when light ($L_{21}$) is refracted at the emission surface of the lens, to an angle ($\theta_{21}$), which is defined by the emission surface of the light source and the light ($L_{21}$), which is emitted from an edge area of the emission surface of the light source and passes through the edge of the second body at the boundary of the first body and the second body, is greater than 1.22.

11. The module according to claim 8, wherein a ratio ($\theta_{32}/\theta_{31}$) of an angle ($\theta_{32}$), which is defined by an emission surface of the lens and light ($L_{32}$), which is emitted from the emission surface of the lens when light ($L_{31}$) is refracted at the emission surface of the lens, to an angle ($\theta_{31}$), which is defined by the emission surface of the light source and the light ($L_{31}$), which is emitted from a center area of the emission surface of the light source and passes through the edge of the second body at a boundary of the second body and the curved surface portion, is greater than 1.34.

12. The module according to claim 8, wherein a ratio ($\theta_{42}/\theta_{41}$) of an angle ($\theta_{42}$), which is defined by an emission surface of the lens and light ($L_{42}$), which is emitted from the emission surface of the lens when light ($L_{41}$) is refracted at the emission surface of the lens, to an angle ($\theta_{41}$), which is defined by the emission surface of the light source and the light ($L_{41}$), which is emitted from an edge area of the emission surface of the light source and passes through the edge of the second body at a boundary of the second body and the curved surface portion, is greater than 1.80.

13. The module according to claim 8, wherein a ratio of a height of the first body and a height of the second body is 0.23:0.336, and the ratio has a tolerance of 10%.

14. The module according to claim 8, wherein a ratio of a height of the first body and a height of the entire lens is 0.23:0.855, and the ratio has a tolerance of 10%.

15. The module according to claim 8, wherein a ratio of a height of the second body and a height of the entire lens is 0.336:0.855, and the ratio has a tolerance of 10%.

16. The module according to claim 8, wherein a ratio of a length of the first body and a maximum radius of the second body is 1:0.728, and a ratio of a length of the first body and a minimum radius of the second body is 1:0.665, and the ratios have a tolerance of 10%.

17. The module according to claim 8, wherein a bottom surface of the first body and a bottom surface of the light source are disposed in a same plane, a ratio of a length of the first body and a minimum radius of the second body is 1:0.665, and the ratio has a tolerance of 10%.

18. A light-emitting element module comprising:
a lens including a first body, a second body on the first body, and a curved surface portion on the second body; and
a light source,
wherein a groove is formed in the first body and the second body,
wherein the first body is wider than the second body and is configured to absorb light,
wherein the first body is disposed so as to protrude from the second body at a boundary of the first body and the second body,
wherein the first body has a sidewall that absorbs light, and the second body has a sidewall that is inclined in a central direction;
wherein an entirety of the light source is disposed in the groove of the lens,
wherein the curved surface portion has a spherical shape,
wherein an emission surface of the lens is disposed in the groove,
wherein a vertical cross section of the second body has a trapezoidal shape,
wherein a ratio ($\theta_{12}/\theta_{11}$) of an angle ($\theta_{12}$), which is defined by an emission surface of the lens and light ($L_{12}$), which is emitted from the emission surface of the lens when light ($L_{11}$) is refracted at the emission surface of the lens, to an angle ($\theta_{11}$), which is defined by an emission surface of the light source and the light ($L_{11}$), which is emitted from a center area of the emission surface of the light source and passes through an edge of the second body at the boundary of the first body and the second body, is greater than 1.04, and
wherein a ratio ($\theta_{22}/\theta_{21}$) of an angle ($\theta_{22}$), which is defined by the emission surface of the lens and light ($L_{22}$), which is emitted from the emission surface of the lens when light ($L_{21}$) is refracted at the emission surface of the lens, to an angle ($\theta_{21}$), which is defined by the emission surface of the light source and the light ($L_{21}$), which is emitted from an edge area of the emission surface of the light source and passes through the edge of the second body at the boundary of the first body and the second body, is greater than 1.22.

19. The module according to claim 18, wherein a ratio ($\theta_{32/31}$) of an angle ($\theta_{32}$), which is defined by the emission surface of the lens and light ($L_{32}$), which is emitted from the emission surface of the lens when light ($L_{31}$) is refracted at the emission surface of the lens, to an angle ($\theta_{31}$), which is defined by the emission surface of the light source and the light ($L_{31}$), which is emitted from the center area of the emission surface of the light source and passes through the edge of the second body at a boundary of the second body and the curved surface portion, is greater than 1.34, and
wherein a ratio ($\theta_{42}/\theta_{41}$) of an angle ($\theta_{42}$), which is defined by the emission surface of the lens and light ($L_{42}$), which is emitted from the emission surface of the lens when light ($L_{41}$) is refracted at the emission surface of the lens, to an angle $\theta_{41}$), which is defined by the emission surface of the light source and the light ($L_{41}$), which is emitted from the edge area of the emission surface of the light source and passes through the edge of the second body at the boundary of the second body and the curved surface portion, is greater than 1.80.

* * * * *